US009157940B2

(12) United States Patent
Dionne

(10) Patent No.: US 9,157,940 B2
(45) Date of Patent: Oct. 13, 2015

(54) POWER MEASUREMENT DEVICE

(75) Inventor: Donald Jeffrey Dionne, Oakville (CA)

(73) Assignee: Smart Energy Instruments, Inc., Oakville (CA)

( * ) Notice: Subject to any disclaimer, the term of this patent is extended or adjusted under 35 U.S.C. 154(b) by 1213 days.

(21) Appl. No.: 13/024,211

(22) Filed: Feb. 9, 2011

(65) Prior Publication Data

US 2012/0200284 A1 Aug. 9, 2012

(51) Int. Cl.
*G01R 21/12* (2006.01)
*G01R 19/25* (2006.01)
*G01R 21/127* (2006.01)
*G06F 7/60* (2006.01)

(52) U.S. Cl.
CPC .......... *G01R 19/2513* (2013.01); *G01R 21/127* (2013.01); *G06F 7/602* (2013.01)

(58) Field of Classification Search
CPC ........................................................ G06F 7/602
USPC .................................... 324/76.36–76.76, 126
See application file for complete search history.

(56) References Cited

U.S. PATENT DOCUMENTS 5,534,827 A 7/1996 Yamaji
5,574,454 A 11/1996 Wilson et al.
6,771,715 B1 8/2004 Rives et al.
6,845,333 B2 1/2005 Anderson et al.
7,084,799 B1 8/2006 Butler
7,746,178 B1 * 6/2010 Humphreys et al. .......... 331/1 A
2006/0017498 A1 * 1/2006 Kuhn et al. .................. 329/347
2006/0119493 A1 * 6/2006 Tal et al. ....................... 341/143
2007/0126484 A1 * 6/2007 Lin et al. ....................... 327/156
2008/0215264 A1 9/2008 Spanier et al.
2009/0206940 A1 * 8/2009 Collados Asensio et al. 332/103
2010/0188148 A1 * 7/2010 Mehta et al. .................. 330/149
2010/0279617 A1 * 11/2010 Osman ......................... 455/63.1
2011/0188604 A1 * 8/2011 Wagner ......................... 375/302
2012/0056624 A1 * 3/2012 Stirk et al. .................... 324/433

OTHER PUBLICATIONS

Andraka, A Survey of CORDIC algorithms for FPGA based coputers, FPGA 98, ACM, Inc., 1998, in 10 pages.
Beis, An Introduction to Delta SIGMA Converters, Jun. 10, 2008, in 6 pages.
Fujisaka et al., Bit-stream signal processing and its application to communication systems, IEE Proc.—Circuits Devices Syst., vol. 149(3), Jun. 2002, pp. 159-166.

(Continued)

*Primary Examiner* — Huy Q Phan
*Assistant Examiner* — Dustin Dickinson
(74) *Attorney, Agent, or Firm* — Knobbe, Martens, Olson & Bear, LLP

(57) ABSTRACT

A power measurement device for sampling current or voltage signals of a power system to produce a 1-bit delta-sigma bitstream. The power measurement device includes a frequency locked loop for determining the power system frequency directly from the 1-bit delta-sigma bitstream. The frequency locked loop includes a 1-bit rotate CORDIC that is configured to produce difference signals having a multi-bit word for each bit of the 1-bit delta-sigma bitstream, and a phase error calculator that determines the difference between the phase of the power system frequency and a phase ramp generated from a frequency measurement value in a frequency register. The phase error calculator feeds back a phase correction signal to the frequency register to lock the frequency measurement value to the power system frequency.

10 Claims, 4 Drawing Sheets

(56) References Cited

OTHER PUBLICATIONS

SEI Smart Energy Instruments, Game Changing Smart Grid Applications, Jan. 2010 SmartGrid Conference, in 15 pages.
Shera, A GPS-Based Frequency Standard, QST, Jul. 1998, pp. 37-44.
Cai et al., "A Compact CPU Archtecture for Sensor Signal Processing", *Proceedings of the IEEE international Symposium on Circuits and Systems*, May 21-24, 2006.
De Caro et al., "Digital Synthesizer/Mixer with Hybrid CORDIC-Multiplier Architecture: Error Analysis and Optimization", *IEEE Transactions on Circuits and Systems-I: Regular Papers*, Feb. 2009, vol. 56, No. 2.
International Search Report of application PCT/CA2012/050041, mailed Apr. 5, 2012.
Chinese Office Action of Feb. 16, 2015 for correspoding Chinese Patent Application No. 201280008452.3. 2 pages, 2 page translation.

* cited by examiner

POWER MEASUREMENT DEVICE

FIELD

The present application generally relates to power system measurements and monitoring and, in particular, to devices for synchronized phasor measurements and transient capture and reporting.

BACKGROUND

Current efforts to improve power system monitoring and event reporting focus upon detecting and correlating data from a number of dispersed sites in the network. To achieve synchronized readings, local data sampling is typically referenced to a time base synched to an absolute time reference, such as can be obtained through the global positioning system (GPS). Measuring devices sample current and voltage values and may perform some analysis on the data, such as harmonic analysis. Typical sampling rates may range from 1 to 12 kHz for high resolution measurements, or 500 times that frequency (e.g. up to 6 Ms/s) for high speed lower-resolution transient detection.

A typical power system measurement device uses separate circuits with different sampling rates in order to accomplish high resolution measurements and high speed transient capture. The use of two circuits introduces complexities for combining the data into a single useful data stream. The gain and aperture match between the two circuits cannot be made perfect.

Typical power system measurement devices low pass filter sampled data to remove noise and other artefacts.

Accuracy, speed and low cost are desirable attributes in developing a power measurement device.

BRIEF DESCRIPTION OF THE DRAWINGS

Reference will now be made, by way of example, to the accompanying drawings which show example embodiments of the present application, and in which.

DESCRIPTION OF EXAMPLE EMBODIMENTS

Figure 1:
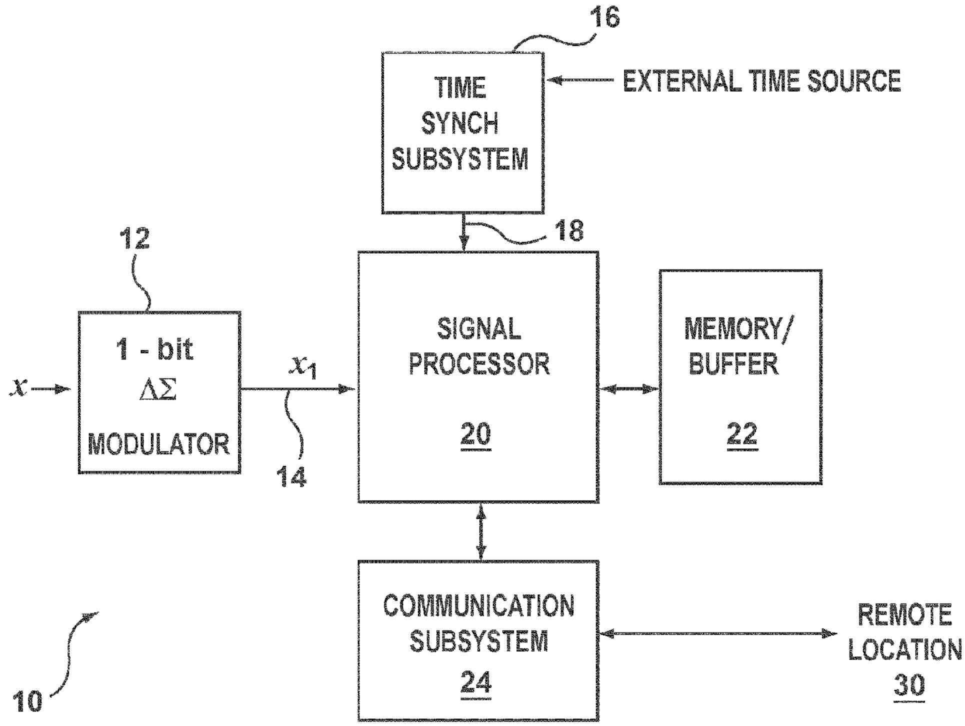
FIG. 1 shows a simplified block diagram of a power measurement device.

In one aspect, the present application discloses frequency locked-loop for locking to a system frequency of a signal sampled by a delta-sigma modulator, wherein the delta-sigma modulator outputs a 1-bit delta-sigma bitstream. The frequency locked-loop includes a 1-bit rotate CORDIC that receives a phase ramp signal and the 1-bit delta-sigma signal and outputs an in-phase difference signal and a quadrature-phase difference signal, the difference signals each having a multi-bit word for each bit of the 1-bit delta-sigma signal, the phase ramp signal being derived from a frequency value maintained by the frequency locked-loop.

In another aspect, the present application describes a power measurement device. The device includes a delta-sigma modulator configured to sample one of voltage or current in a power system and output a 1-bit delta-sigma bitstream, the voltage or current having a system frequency; a frequency locked-loop configured to receive the 1-bit delta-sigma bitstream and output a frequency value locked to the system frequency; and a transient capture module configured to receive the 1-bit delta-sigma bitstream, filter selected spectra from the 1-bit delta-sigma bitstream to obtain transient data.

In a further aspect, the present application discloses a power measurement device includes a delta-sigma modulator configured to sample one of voltage or current in a power system and output a 1-bit delta-sigma signal, the voltage or current having a system frequency; and a frequency locked-loop. The frequency locked-loop includes a 1-bit rotate CORDIC that receives a phase ramp signal and the 1-bit delta-sigma signal and outputs an in-phase difference signal and a quadrature-phase difference signal, the difference signals each having a multi-bit word for each bit of the 1-bit delta-sigma signal, a phase error calculator configured to receive the difference signals and to output a phase error signal based upon the difference between a phase of the phase ramp signal and the phase of the system frequency contained within the 1-bit delta-sigma signal, a frequency register containing a frequency value, a phase accumulator configured to produce the phase ramp signal having a periodicity determined by the frequency value. The frequency locked-loop is configured to adjust the frequency value based upon the phase error signal so as to lock the frequency value to the system frequency.

In yet a further aspect, the present application describes a method of measuring power system characteristics, the power system having a system frequency and one or more phases. The method includes sampling one of voltage or current of the power system to produce a 1-bit delta-sigma bitstream; generating in-phase and quadrature difference signals from the 1-bit delta-sigma bitstream using a 1-bit rotate CORDIC receiving a phase ramp signal, wherein the phase ramp signal is based upon a frequency value; and locking the frequency value to the system frequency by generating a phase error signal based upon a difference between a phase of the phase ramp signal and the phase of the system frequency contained within the 1-bit delta-sigma signal, wherein the difference is obtained from the difference signals.

Other aspects and features of the present application will be understood by those of ordinary skill in the art from a review of the following description of examples in conjunction with the accompanying figures.

In the description that follows a number of simplifications are made for ease of illustration. For example, those skilled in the art will appreciate that in many instances power measurement devices may be configured to measure three phases of voltage and current, whereas in the embodiments described herein a single phase of voltage and/or current may be illustrated for simplicity.

Reference is first made to FIG. 1, which shows a simplified block diagram of a power measurement device 10. The device 10 includes a 1-bit Delta-Sigma (DS) modulator 12 for measuring the power quantity (voltage or current on one of the phases) and producing a 1-bit signal or bitstream 14. The clocking of the DS modulator 12, and thus the bit rate of the output bitstream 14, may range from 10 KHz to 6 Ms/s, depending on the resolution and frequency response required in the implementation. It will be understood that conventional DS converters employ a low-pass filter at the output to remove the high frequency quantization noise components of the delta-sigma modulation. The device 10 does not employ such low pass filtering but, instead, retains the high frequency components as will be discussed and described further below. As noted above, for simplicity a single DS modulator 12 is illustrated in FIG. 1. Practical implementations may have two or more DS modulators for measuring current and voltage signals on one or more phases. In the case of a three-phase three-wire system, six DS modulators may be used so as to measure current and voltage on all three phases. Similarly, in the case of a three-phase four-wire system, eight DS modulators may be used so as to measure current and voltage on all three phases and the neutral.

The device 10 further includes a time synch subsystem 16 that receives an external time source signal. The external time source signal provides an absolute time reference and may be obtained from, for example, GPS or an IRIG-B signal. Other external signals may also serve as the absolute time reference in some implementations. The time synch subsystem 16 provides a clock correction signal or error signal 18.

The device 10 includes a signal processor 20. The signal processor 20 receives the bitstream 14 and performs signal analysis and measurements as described in greater detail below. In particular, the signal processor 20 is implemented to operate on the 1-bit DS output bitstream 14 directly. The signal processor 20 receives the clock correction signal 18 for accurately correcting local oscillators (not illustrated). Rather than locking the local oscillators to the external absolute time reference signal, such as GPS, the time synch subsystem 16 provides a correction factor in the form of the clock correction signal 18, which in one implementation may provide up to a 100 parts per million correction factor. The signal processor 20 may incorporate the correction factor from the clock correction signal 18 into a frequency/phase locked loop used to measure frequency and phase of the bitstream 14 signal, and thereby producing accurate synchronized phasor (synchrophasor) measurements. In other embodiments, the local oscillator may be used more directly.

The signal processor 20 produces high accuracy synchrophasor measurements of the power system fundamental. It may also selectively detect and measure phasors of harmonics present (selected by power content), perform transient detection, and perform residual waveform capture.

The device 10 may include a memory or buffer 22 for storing measurement data. It also includes a communication subsystem 24 for communicating with a remote location 30. The communication subsystem 24 may implement any of a variety of communication protocols and physical layer connections. In one example embodiment, the communication subsystem 24 may implement Ethernet (10/100 or Gigabit, for example), GSM, 802.11 WiFi, USB, etc. In some implementations the communication subsystem 24 may operate in accordance with two or more communication protocols.

FIG. 1 does not illustrate the data format used to transmit power measurements or analysis to the remote location 30 via the communication subsystem 24. The compression and encoding of data may be implemented by the signal processor 20, the communication subsystem 24, or both. In some example embodiments, data may be entropy encoded using a suitable lossless coding scheme, such as variable length coding (VLC), like Huffman coding or arithmetic coding.

The signal processor 20 may be implemented in a number of ways. In some embodiments, the signal processor 20 may be implemented using a field programmable gate array (FPGA). In some embodiments, it may be implemented using a suitable programmed general purpose microcontroller or microprocessor. In yet other embodiments, it may be implemented using a digital signal processor. In yet further embodiments, it may be implemented using an application-specific integrated circuit (ASIC). In some embodiments, the foregoing may be supplemented with discrete analog and/or digital components for implementing certain operations or aspects of the signal processor 20. The full range of possibilities will be apparent to those of ordinary skill in the art in light of the following description.

It will be appreciated that the simplified diagram shown in FIG. 1 omits a number of components or elements that may be included in the device 10, such as debugging circuitry, local oscillator circuitry for an internal clock, isolation hardware, power source circuitry, etc.

Figure 2:
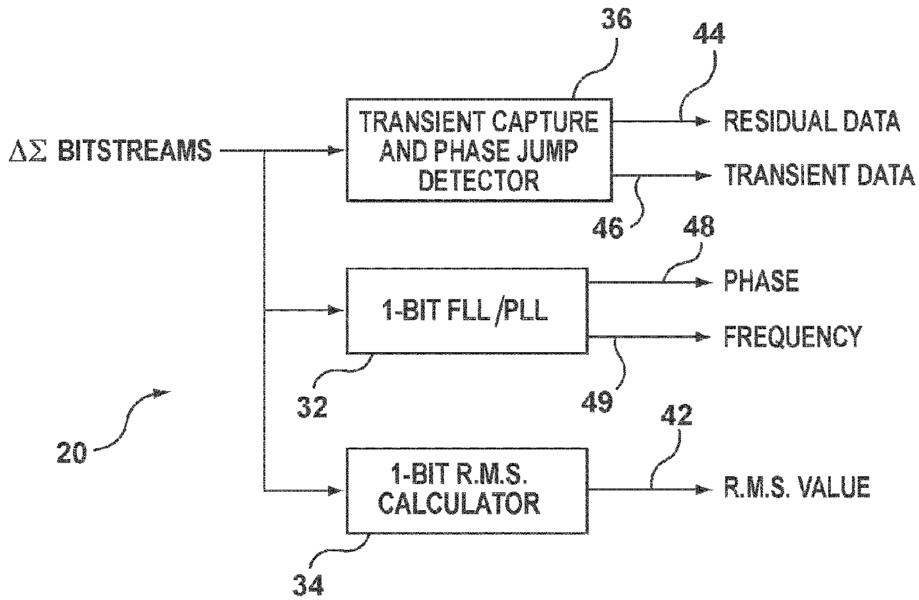
FIG. 2 shows a simplified example block diagram of the signal processor from the power measurement device of FIG. 1.

Reference is now made to FIG. 2, which shows a simplified example block diagram of the signal processor 20. The one-bit DS bitstream 14 is input to the signal processor 20. The signal processor 20 also receives the time correction signal 18 (FIG. 1) and a local clock signal (not shown).

The signal processor 20 includes a 1-bit dual frequency locked-loop (FLL) and phase-locked-loop (PLL) 32 architecture. The 1-bit FLL/PLL 32 outputs phasor data, such as a frequency signal 49 and a phase signal 48. It will be understood that in the case of a polyphase system, there may be multiple phase signals 48. It will also be understood that in some implementations more than one frequency signal 49 may be output, such as one signal measured from a voltage transformer signal, and another from a current transformer signal. It may also be noted that in some embodiments it may be advantageous to have more than 1 FLL. For example, if the measurement device 10 (FIG. 1) were configured for use as a Synchro Check device to confirm that a new power generation source is at the correct phase before connection to the system.

The signal processor 20 further includes a 1-bit RMS calculator 34. The RMS calculator 34 calculates the root-mean-square value of the input DS bitstream, thereby producing an RMS signal 42.

The signal processor 20 also includes a transient capture and phase jump detection component 36. The transient capture and phase jump detection component 36 is configured to detect possible transients in the bitstream 14. The transient capture and phase jump detection component 36 may output a residual data signal 44 in some embodiments. The residual data signal 44 includes the noise data from the delta sigma modulation. In this regard, the transient capture and phase jump detection component 36 may remove "significant" or "fundamental" components from the signal by spectral selection, leaving the residual components. The residual data signal 44 contains these components. In some embodiments, the transient capture and phase jump detection component 36 may output a transient detect signal 46. The transient capture and phase jump detection component 36 may generate the transient detect signal 46 by analyzing the residual data, for example using spectral power analysis or another mechanism for detecting large magnitude changes or fluctuations in the noise signal, and outputting the transient detect signal 46 in response to detection of possible transient events in the residual data.

Figure 3:
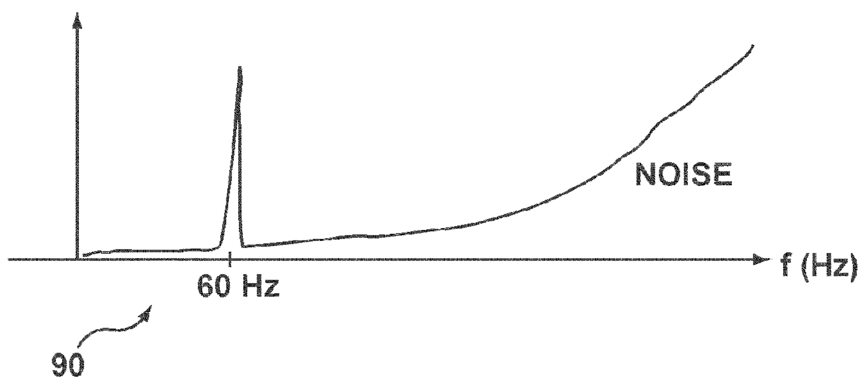
FIG. 3 shows a simplified example graph of the spectrum of a power signal after delta-sigma modulation.

Reference is now made to FIG. 3, which shows a simplified example graph 90 of the spectrum of a power signal after DS modulation, i.e. the spectrum of one of the 1-bit DS bitstreams 14. The graph 90 shows that the power system fundamental frequency is found at about 60 Hz, and that, because the DS modulator pushes the quantization noise to higher frequencies, less signal to noise ratio is available and more noise is encountered in the system at higher frequencies. In conventional power measurement, low pass filtering may be applied to remove the noise component before phasor calculation and analysis; however, transient data and other artifacts of interest may be found in the high frequency noise. Accordingly, in accordance with an aspect of the present application, phasor calculation and analysis is performed directly on the 1-bit bitstream 14 without first low pass filtering the bitstream 14.

Figure 4:
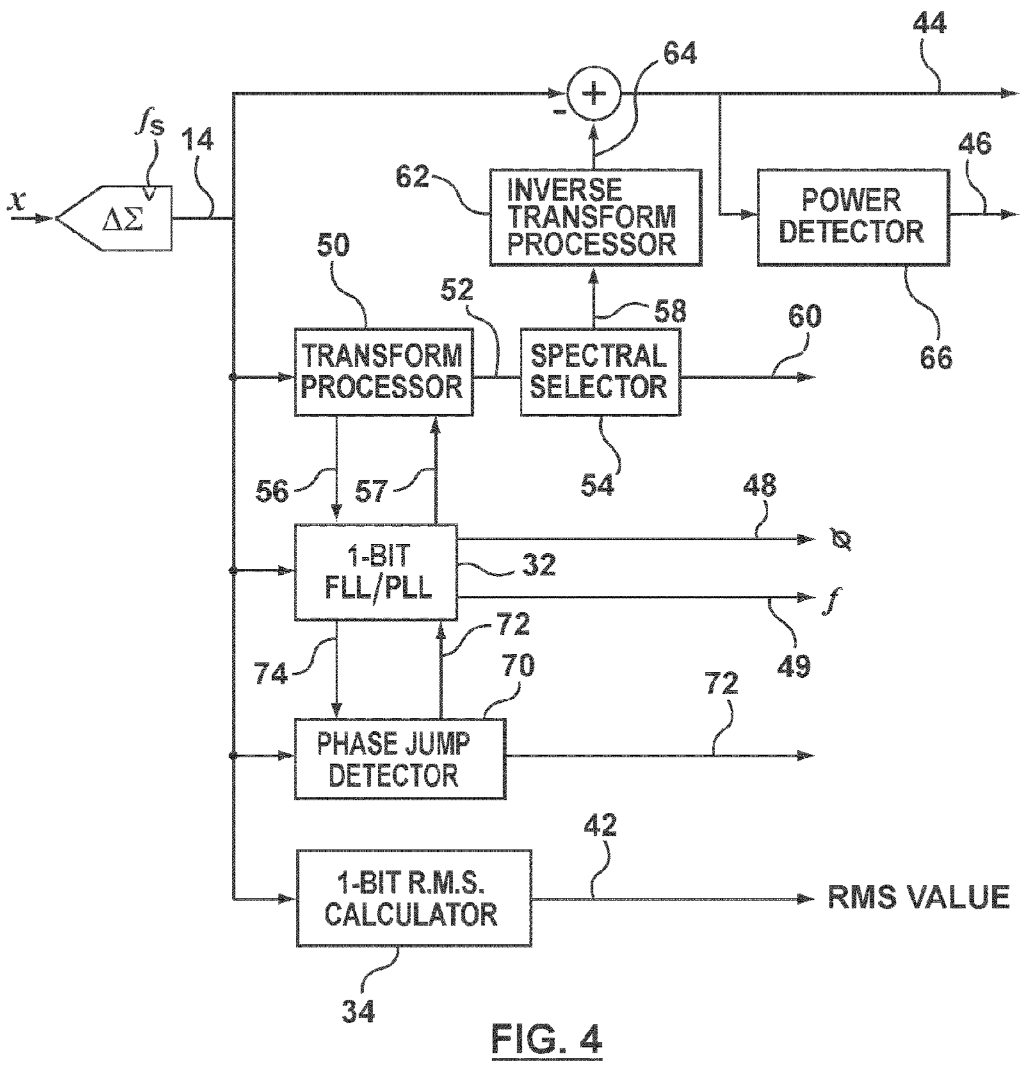
FIG. 4 shows a more detailed block diagram of an example signal processor.

Reference is now made to FIG. 4, which shows a more detailed block diagram of an example signal processor 20. The signal processor 20 in this example includes a transform processor 50, such as a Discrete Wavelet Transform (DWT) or a Discrete Fourier Transform (DFT), which produces a transform domain signal 52 that represents the spectral components found in the bitstream 14. The transform processor 50 may also be configured to produce a signal frequency 56, representing the detected fundamental frequency of the power system signal. This signal frequency 56 may be fed to the 1-bit FLL/PLL 32 to seed the signal frequency value in the FLL/PLL. In return, the 1-bit FLL/PLL 32 may provide a frequency correction signal 57, which the transform processor 50 may use to centre the bins of the transform operation so as to tune the transform to the exact signal frequency. In some cases, the frequency correction signal 57 may be the actual frequency signal measured by the FLL.

A spectral selector 54 may be configured to receive the transform domain signal 52 and select particular components. The selected components may be, for example, those at the power system fundamental frequency and, in some cases, harmonics of the fundamental frequency. The spectral selector 54 may have a model or algorithm for identifying "significant" components for selection from the transform domain signal. In some instances, it may be a predefined model. In some cases, it may be adaptive and responsive to changes in the magnitude of components. The spectral selector 54 may output the selected components as a fundamental spectral components signal 58. The spectral selector 54 may alternatively or also output a harmonics signal 60. The harmonics signal 60 may include spectral data for harmonic components, but not necessarily the fundamental power system frequency component.

The selected components output as the fundamental spectral components signal 58 are then passed through an inverse transform processor 62. The inverse transform processor 62 converts the selected components back to a time-domain signal 64 containing the selected components. The time-domain signal 64 containing the selected components is then subtracted from the 1-bit DS bitstream 14. In the embodiment shown in FIG. 4, the subtraction may be implemented as a 1-bit substractor for subtracting 1-bit signals. In some cases, the time-domain signal 64 may be converted from a multibit word signal to a 1-bit signal for the subtraction. In yet other embodiments, the input DS bitstream 14 may be converted to a multibit word signal and the subtraction may be implemented as a multibit word subtractor.

In yet another embodiment, the subtraction may be implemented as a subtraction of the fundamental spectral components signal 58 from the transform domain signal 52. The resulting signal, which is a transform domain transients signal, is inverse transformed through the inverse transform processor 62 and the output of that process is the residual signal 44. This embodiment eliminates time domain manipulation. The successful implementation of this embodiment may be partly dependent upon the DWT/IDWT pair used.

The result of the subtraction is the removal of the selected components from the bitstream 14, leaving a residual signal 44. The residual signal 44 contains the high frequency noise components and other artifacts from the bitstream 14, including any transients or other features. A power detector 66 may be used to identify whether any transients are likely present in the residual signal 44. The power detector 66 may attempt to identify brief but significant changes in power within the spectrum. In some instances the power detector 66 may receive data from the transform processor 52 (not shown). The power detector 66 may output the transient detect signal 46. In some implementations, the transient detect signal may trigger the capture and reporting of the residual data in the residual signal 44. Otherwise, the residual signal 44 may be discarded or temporarily stored for later analysis, if desired.

The 1-bit FLL/PLL 32 may supply phase information 74 to a phase jump detector 70. The phase jump detector 70 also receives the 1-bit bitstream 14 and produces a phase jump detection signal 72 in the event that it determines there has been a phase change greater than a predefined threshold within a period of time. The phase jump detection signal 72 may also be input to the 1-bit FLL/PLL 32 to allow the 1-bit FLL/PLL 32 to make adjustments to avoid phase jump errors, such as adjusting the FLL/PLL filter constants. In one embodiment, the filter constants may be adjusted so as to quickly achieve lock or re-lock and then adjusted to reduce phase noise (phase measurement accuracy) by tightening the loop bandwidth once locked. In one example implementation (not shown), the phase jump detector 70 includes a transform operator, such as a discrete Hilbert transform, applied to the 1-bit DS bitstream 14 and a comparator for comparing phase information from the 1-bit FLL/PLL 32 to phase data for the 1-bit DS bitstream 14 from the transform operator.

As noted above, the phasor data, such as the frequency signal 49 and phase signal(s) 48, are obtained using the 1-bit FLL/PLL 32 operating upon the unfiltered 1-bit DS bitstream 14. The 1-bit DS bitstream 14 is typically clocked at a high sampling frequency. In one example the sampling frequency is about 6 Mbit/s. To obtain accurate phasor data, the 1-bit FLL/PLL 32 is implemented using high-speed single-bit arithmetic. In one example embodiment, the 1-bit FLL/PLL 32 is implemented using a direct digital synthesizer (DDS) (not shown). In another example embodiment, the 1-bit FLL/PLL 32 is implemented in a Coordinate Rotation Digital Computer (CORDIC) based architecture. The CORDIC architecture is advantageous in that it requires few gates and simple arithmetic operations.

It will be recalled that CORDIC is useful in calculating the sine or cosine of an angle. In particular, CORDIC techniques can be used to realize the expressions:

$$x_m = K[x_0 \cos(z_0) - y_0 \sin(z_0)] \quad (1)$$

$$y_m = K[y_0 \cos(z_0) + x_0 \sin(z_0)] \quad (2)$$

If $y_0$ is set to zero (which means $x_0$ defines a vector on the x-axis, as will be explained below), then the equations become:

$$x_m = Kx_0 \cos(z_0) \quad (3)$$

$$y_m = Kx_0 \sin(z_0) \quad (4)$$

In the above expressions, $x_0$ and $y_0$ are the Cartesian coordinates of the input signal or vector, $z_0$ is an angle that is signed ±1 depending on the direction of rotation, and K is a constant. The effect is the rotation (and scaling by K) of the input vector $r_0$ at coordinates $x_0$, $y_0$, by the angle $z_0$ to new coordinates $x_m$, $y_m$. The implementation of the CORDIC is the iterative rotation of the vector by progressively smaller angles until $z_0$ is approached with the required precision, meaning the absolute value of $z_m$ is less than the required precision in angle. An advantage of the CORDIC is that if the rotation angles $z_i$ are restricted such that $\tan(z_i)=\pm 2^i$, then the rotations can be effected using shift and add operations. Note that m represents the number of stages or iterations.

Figure 5:
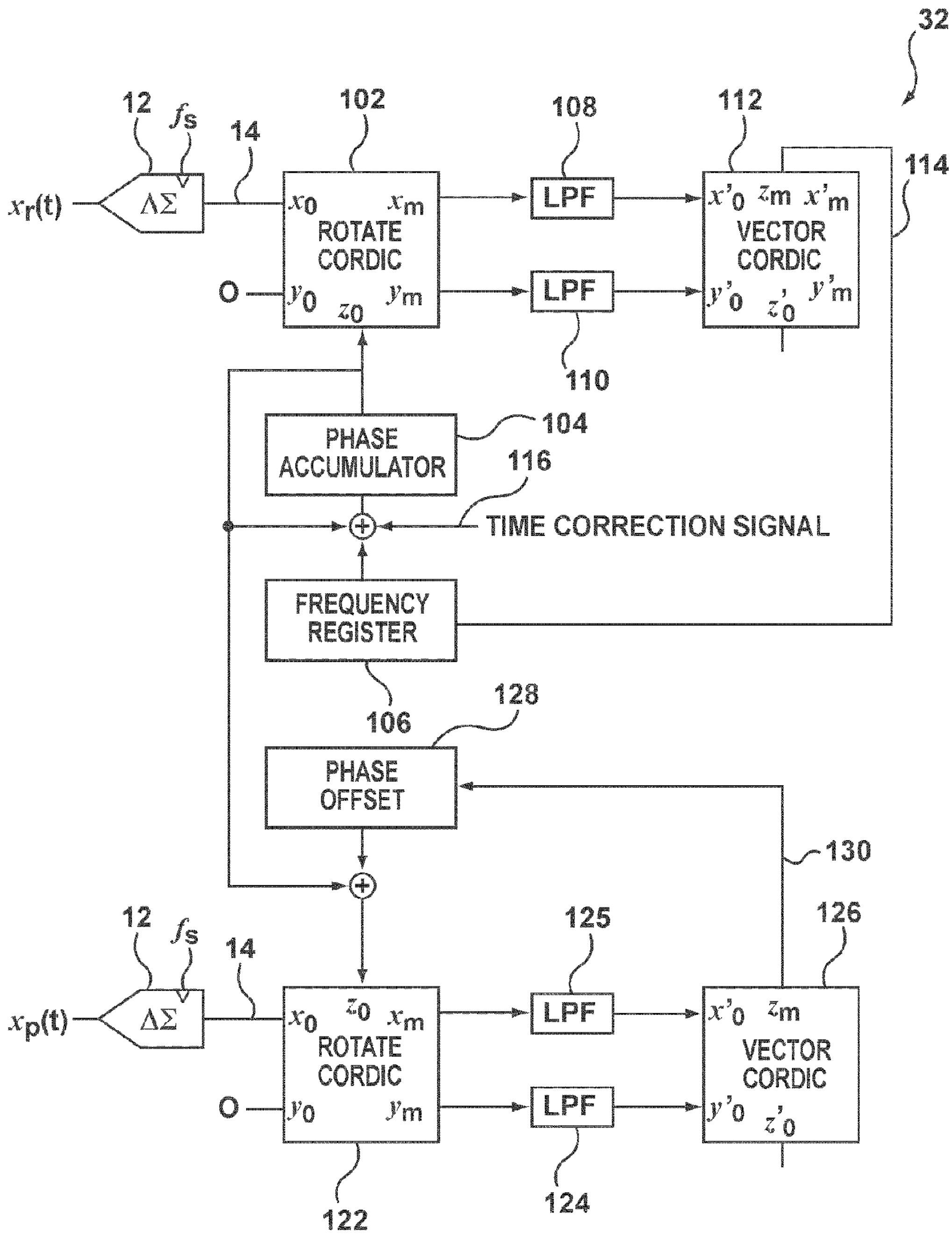
FIG. 5 shows a simplified block diagram of a CORDIC-based implementation of a 1-bit FLL/PLL.

Reference is now made to FIG. 5, which shows a simplified block diagram of a CORDIC-based implementation of the 1-bit FLL/PLL 32. One of the input signals serves as a reference signal $x_r(t)$, and the other signals (seven other signals, in a three-phase four-wire system) are designated as phase signals $x_p(t)$. A fundamental frequency measurement is made with regard to the reference signal $x_r(t)$, while phase offsets are determined for the phase signals $x_p(t)$. For ease of illustration, only one phase signal $x_p(t)$ is shown in FIG. 5.

The DS modulators 12 convert the input signals to 1-bit DS bitstreams 14. The 1-bit DS bitstream 14 for reference signal $x_r(t)$ is input to a rotate CORDIC 102. The rotate CORDIC 102 receives an input angle $z_0$, which in this case is a ramp function produced by a phase accumulator 104. The rotate CORDIC 102 outputs an in-phase digital word $x_m$, for each input bit $x_0$, wherein $x_m$ is a multibit word of about 2m bits of precision. Further details of example implementations of the 1-bit rotate CORDIC 102 are provided below.

The output of the 1-bit rotate CORDIC 102 are the following two signals:

$$x_m=Kx_0\cos(z_0) \tag{5}$$

$$y_m=Kx_0\sin(z_0) \tag{6}$$

In this case, $x_0$ is the 1-bit DS bitstream, which is a DS bitstream representing the power system signal (ignoring for the purposes of this explanatory mathematics, any harmonics and noise).

It will also be noted that the phase ramp produced by the phase accumulator 104 of the 1-bit FLL/PLL 32 is driven by a frequency register 106 containing the measured power system fundamental frequency (this may initially be seeded to 60.0 Hz, but will then lock to the actual frequency). In other words, the angle $z_0$ is based upon the power system frequency found in $x_0$.

Accordingly, the output of the rotate CORDIC 102 are the signals:

$$x_m=K\cos(z_0)*a\sin(\omega t+\phi) \tag{7}$$

$$y_m=K\sin(z_0)*a\sin(\omega t+\phi) \tag{8}$$

It will be appreciated that this mixing results in a half amplitude difference signal at $z_0-(\omega t+\phi)$ and a half amplitude additive signal at $z_0+(\omega t+\phi)$. As $z_0$ approaches $\omega t$, the difference signals are essentially a pair of DC signals, whereas the additive signal is an AC signal. Accordingly, since we are interested in the difference signals, $x_m$ and $y_m$ are passed through low pass filters 108, 110 and the filtered difference signals are input to a vector CORDIC 112.

The vector CORDIC 112 is similar to the rotate CORDIC 102, but instead of rotating an input vector defined by coordinates to a new set of coordinates, the vector CORDIC 112 rotates the input vector to the x-axis and outputs the angle required to make that rotation occur. The angle output $z_m$ from the vector CORDIC 112 is given by:

$$z_m=z_0'+\tan^{-1}(y_0'/x_0') \tag{9}$$

For clarity the input signals are labeled $x_0'$ and $y_0'$. The input $z_0'$ is an arbitrary constant angle which, in one embodiment is set to 0. In another embodiment, it may be set to $\pi/4$, for example if the ratio in the arctangent was expected to lock at unity.

It will be recalled that the low pass filtered input signals to the vector CORDIC 112 are the (x,y) DC projection of the input signal onto the reference oscillator. The input signal and the reference oscillator are sinusoidal in nature. Accordingly the phase offsets $x_0'$ and $y_0'$, may be considered like a cosine function and a sine function, respectively. Their ratio reduces to a tangent function. As a result Equation (9) may become:

$$z_m=z_0'+z_0-(\omega t+\phi) \tag{10}$$

In other words, the output of the vector CORDIC 112 is a phase error signal 114. The phase error signal is input to the frequency register 106 to adjust the fundamental frequency contained therein and lock to the power system frequency.

As noted previously, the frequency register 106 feeds the fundamental frequency to the phase accumulator 104 through an additive loop to form a numerically controlled oscillator that produces the phase ramp to supply $z_0$. A time correction signal 116 may be added to the numerically controlled oscillator to correct for errors in the local oscillators. The time correction signal 116 may be derived from external time sources, such as GPS or an IRIG-B signal. The time correction signal 116 may be added to the input to the phase accumulator 104, i.e. the step size input to the accumulator 104, or may be input directly to the frequency register 106. In yet another embodiment, the time correction signal 116 plus 1 (unity) may be multiplied by the output of the frequency register 106 before it is used as the input step size to the accumulator 104.

It will be appreciated that this portion of the 1-bit FLL/PLL 32 provides a frequency lock to the fundamental frequency of the power system, which is found in the frequency register 106 once it has locked. The rotate CORDIC 102 operates on the 1-bit input signal producing a output word of about 2m for each bit of the input signal $x_0$. In two example embodiments, the m-stage rotate CORDIC 102 may be implemented by clocking the CORDIC at m times the sampling frequency $f_s$, or by unrolling the CORDIC and clocking it at about the sampling frequency but accepting an m bit delay. The latter example will be shown in greater detail below, but the present application is not limited to an unrolled configuration.

Referring still to FIG. 5, the phase signal $x_p(t)$ is input to a similar circuit. In particular, the phase signal $x_p(t)$ serves as the 1-bit input signal $x_0$ to a rotate CORDIC 122. The rotate CORDIC 122 receives the same ramp function $z_0$ from phase accumulator 104, but phase adjusted by the value from a phase offset register 128. The output of the rotate CORDIC 122 is low pass filtered through LPFs 125 and 124 and the filtered difference signals are input to a vector CORDIC 126. The vector CORDIC 126 supplies phase offset correct signal 130. The phase offset correction signal 130 is fed to the phase offset register 128, which contains the phase difference between the phase signal $x_p(t)$ and the reference signal $x_r(t)$.

It will be understood from the present description that the vector CORDICs 112, 126 need not operate at the same speed as the rotate CORDICs 102, 122. In fact, in some example embodiments, the hardware for implementing the vector CORDICs 112, 126 may be shared amongst the input signals, meaning only a single hardware implementation of a vector CORDIC 112, 126 may be required. Additional hardware sharing may be possible in other implementations, depending on the speed of the hardware clocking and the sampling frequency $f_s$.

In one embodiment, the vector CORDICs 112, 126 may be replaced by alternative circuitry for determining the phase difference based on the input difference signals. For example, in one alternative embodiment the vector CORDIC 112 may be replaced with a division and a piece-wise linear interpolation of arctangent. The present application is not limited to the use of a vector CORDIC for this function. Nevertheless, it will be appreciated that the elimination of a division through use of the vector CORDIC 112 can be advantageous in some implementations.

Figure 6:
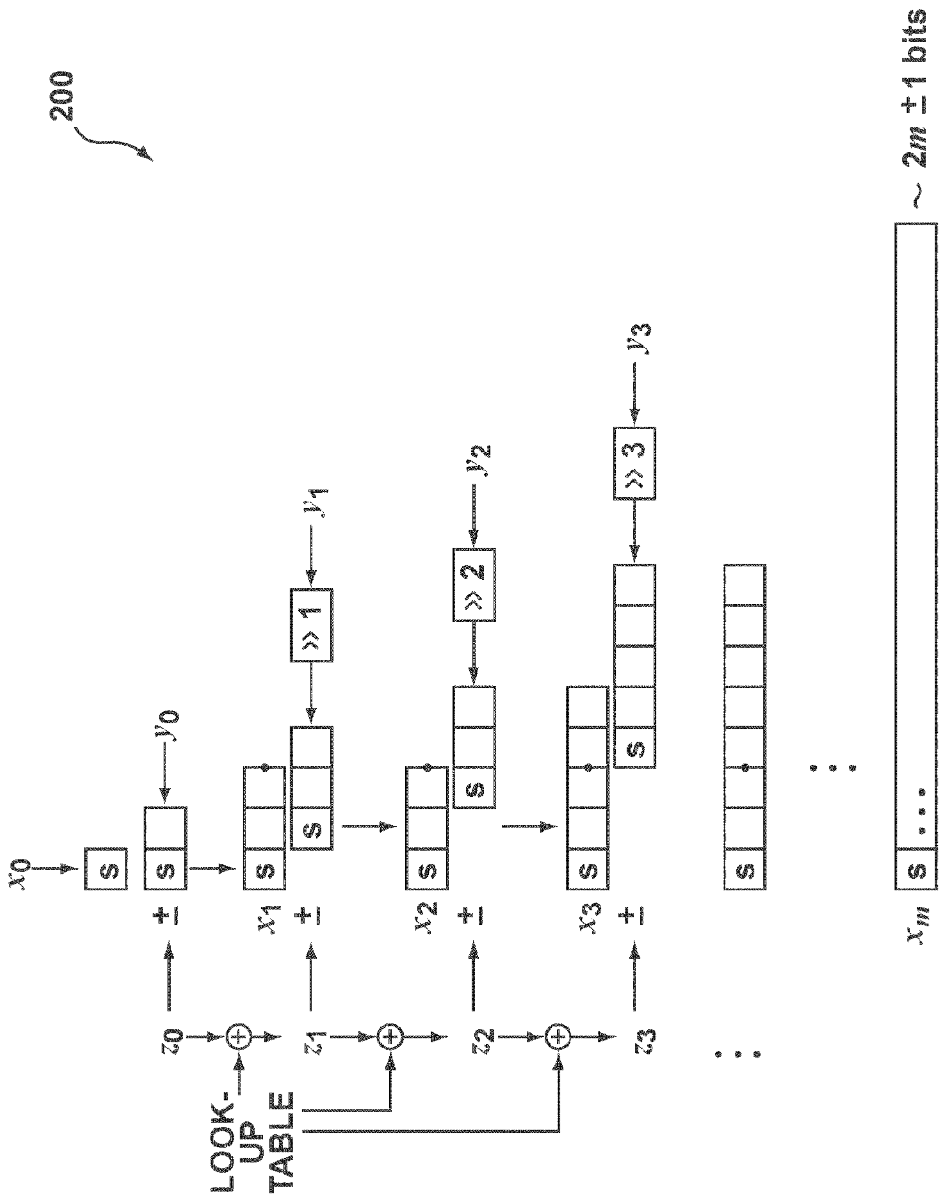
FIG. 6 diagrammatically illustrates one example implementation of a 1-bit rotate CORDIC; and Similar reference numerals may have been used in different figures to denote similar components.

Reference is now made to FIG. 6, which diagrammatically illustrates one example implementation of a 1-bit rotate CORDIC 200. In this example, only the x-side of the CORDIC 200 is illustrated for clarity. As discussed above, the rotate CORDIC 200 has m stages and results in an output word having about 2m bits of precision for each input bit. This enables significantly precise frequency and phase locking and measurement using unfiltered 1-bit DS signals. As will be shown below, the implementation, in one embodiment, can be efficiently realized in hardware using shift and add operations.

The input to the CORDIC 200 is a bit from the 1-bit DS signal 14 (FIG. 5), which is shown as $x_0$. The value for $x_1$ depends upon $y_0$ and $z_0$. In particular, the value of any $x_i$ is given by:

$$x_{i+1}=x_i-y_i\cdot d_i\cdot 2^{-i}, \quad (11)$$

where $d_i=-1$ if $z_i<0$ and +1 otherwise

Each $z_i$ is calculated as:

$$z_{i+1}=z_i-d_i\cdot\tan^{-1}(2^{-i}) \quad (12)$$

Using a look-up table for the term $-d_i\cdot\tan^{-1}(2^{-i})$, the remaining operations for realizing these values are additions and shifts. Moreover, because the input is a single bit in the first stage, the process is hardware efficient because a the precision length grows with the stages, meaning a full output word need not be carried in each stage of the calculations.

The implementation of the rotate CORDIC 200 shown in FIG. 6 is an unrolled CORDIC. The value $x_0$ may be notionally considered a sign bit in some sense. Similarly the value $y_0$ (which is set to zero), may be considered a signed zero.

The rotate CORDIC 200 is thus implemented using simple binary addition and shift operations. Each of the m stages of the CORDIC 200 includes bit-shifting the value from the parallel y-side of the CORDIC by a predetermined number of places, and adding or subtracting it from the $x_i$ value from that stage depending on whether $z_i$ is below zero or not. In a parallel operation, the value of $z_i$ is determined at each stage based upon the previous value and look-up table value for the term $-d_i\cdot\tan^{-1}(2^{-i})$. The look-up table value is fixed at each stage and can be hardwired if desired.

It will be appreciated that the operations involved in the CORDIC 200 are relatively straightforward to implement using binary add and shift operations. In one embodiment, the CORDIC 200 is implemented using a field programmable gate array. In one such embodiment, the rotate CORDIC 200 may be implemented using only about $m^2-m+2$ adders in total for the m stages of x and y calculations to produce an output word of about 2m bits of precision.

It will also be appreciated that the above-described implementation of the one-bit rotate CORDIC 200 carries precision as the word size grows, rather than maintaining full word precision at every stage. Accordingly, since the input is a single bit at the first stage, the CORDIC only needs to maintain single bit precision at that stage.

It will be understood that the foregoing power measurement device may be implemented partly in hardware and partly in software. In some embodiments, the implementation may include one or more field programmable gate arrays (FPGA). In some embodiments, the implementation may include one or more microprocessors or microcontrollers. In some embodiments, the implementation may include one or more application-specific integrated circuits (ASIC). The selection of particular hardware components may be based upon cost, speed, operating environment, etc. The selection and programming of such components will be within the understanding of a person of ordinary skill in the art having regard to the detailed description provided herein.

In yet a further aspect, the present application discloses a computer-readable medium having stored thereon computer-executable instructions which, when executed by a processor, configure the processor to execute any one or more of the methods described above.

Certain adaptations and modifications of the described embodiments can be made. Therefore, the above discussed embodiments are considered to be illustrative and not restrictive.

What is claimed is:

1. A power measurement device, comprising:

a delta-sigma modulator configured to sample one of voltage or current in a power system and output a 1-bit delta-sigma signal, the voltage or current having a system frequency; and a frequency locked-loop including, a 1-bit rotate CORDIC that receives a phase ramp signal and the 1-bit delta-sigma signal and outputs an in-phase difference signal and a quadrature-phase difference signal, the difference signals each having a multi-bit word for each bit of the 1-bit delta-sigma signal, a phase error calculator configured to receive the difference signals and to output a phase error signal based upon the difference between a phase of the phase ramp signal and the phase of the system frequency contained within the 1-bit delta-sigma signal, a frequency register containing a frequency value, a phase accumulator configured to produce the phase ramp signal having a periodicity determined by the frequency value, wherein the frequency locked-loop is configured to adjust the frequency value based upon the phase error signal so as to lock the frequency value to the system frequency.

2. The power measurement device claimed in claim 1, wherein the 1-bit rotate CORDIC receives the 1-bit delta-sigma signal from the delta-sigma modulator without any low-pass filtering.

3. The power measurement device claimed in claim 1, wherein the frequency locked-loop includes low pass filters for filtering the outputs of the 1-bit rotate CORDIC to produce the difference signals.

4. The power measurement device claimed in claim 1, further including one or more additional delta-sigma modulators for measuring one of voltage and current on one or more phases of the power system, each additional delta-sigma modulator producing an additional 1-bit delta-sigma signal, and further comprising a phase-locked loop for each of the additional 1-bit delta-sigma signals, each phase-locked loop including a 1-bit rotate CORDIC for receiving a respective one of the additional 1-bit delta-sigma signals and producing in-phase and quadrature difference signals.

5. The power measurement device claimed in claim 1, wherein the phase error calculator comprises a vector CORDIC.

6. The power measurement device claimed in claim 1, wherein the 1-bit rotate CORDIC comprises a m stage CORDIC and the mutli-bit word is 2 m±1 bits for every input bit of the 1-bit delta-sigma signal.

7. The power measurement device claimed in claim 1, further including a communication subsystem configured to read the frequency value in the frequency register and to transmit the frequency value to a remote location together with a time stamp.

8. The power measurement device claimed in claim 1, further comprising a transient capture and phase jump detection component.

9. The power measurement device claimed in claim 1, further comprising an RMS calculator for determining a RMS value for the voltage or current based upon the 1-bit delta-sigma signal.

10. A frequency locked-loop for locking to a system frequency of a signal sampled by a delta-sigma modulator, wherein the delta-sigma modulator outputs a 1-bit delta-sigma bitstream, the frequency locked-loop comprising:

a 1-bit rotate CORDIC that receives a phase ramp signal and the 1-bit delta-sigma signal and outputs an in-phase difference signal and a quadrature-phase difference signal, the difference signals each having a multi-bit word for each bit of the 1-bit delta-sigma signal, the phase ramp signal being derived from a frequency value maintained by the frequency locked-loop;

a phase error calculator configured to receive the difference signals and to output a phase error signal based upon the difference between a phase of the phase ramp signal and the phase of the system frequency contained within the 1-bit delta-sigma signal; and a phase accumulator configured to produce the phase ramp signal having a periodicity determined by the frequency value, wherein the frequency locked-loop is configured to adjust the frequency value based upon the phase error signal so as to lock the frequency value to the system frequency.

* * * * *